US011823886B2

(12) United States Patent
Harada et al.

(10) Patent No.: US 11,823,886 B2
(45) Date of Patent: Nov. 21, 2023

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: KOKUSAI ELECTRIC CORPORATION, Tokyo (JP)

(72) Inventors: Kazuhiro Harada, Toyama (JP); Masayoshi Minami, Toyama (JP); Shintaro Kogura, Toyama (JP); Shogo Otani, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 258 days.

(21) Appl. No.: 17/465,269

(22) Filed: Sep. 2, 2021

(65) Prior Publication Data
US 2021/0398794 A1    Dec. 23, 2021

Related U.S. Application Data

(63) Continuation of application No. PCT/JP2019/008550, filed on Mar. 5, 2019.

(51) Int. Cl.
*H01L 21/02* (2006.01)
*C23C 16/30* (2006.01)
(Continued)

(52) U.S. Cl.
CPC .......... *H01L 21/022* (2013.01); *C23C 16/308* (2013.01); *C23C 16/325* (2013.01);
(Continued)

(58) Field of Classification Search
CPC .............. H01L 21/022; H01L 45/1286; H01L 21/0214; H01L 21/02167; H01L 21/0217;
(Continued)

(56) References Cited

U.S. PATENT DOCUMENTS 6,271,084 B1 * 8/2001 Tu ........................... H01L 28/60
257/E21.59
9,548,266 B2 * 1/2017 Ajuria ..................... H01L 24/02
(Continued)

FOREIGN PATENT DOCUMENTS

JP    2011-238894 A    11/2011
JP    2013-140944 A    7/2013
(Continued)

OTHER PUBLICATIONS

International Search Report, PCT/JP2019/008550, dated May 7, 2019, 5 pgs.

*Primary Examiner* — Caleb E Henry
(74) *Attorney, Agent, or Firm* — Volpe Koenig

(57) ABSTRACT

There is included (a) loading a substrate where a conductive metal-element-containing film is exposed on a surface of the substrate into a process chamber under a first temperature; (b) supplying a reducing gas to the substrate while raising a temperature of the substrate to a second temperature higher than the first temperature in the process chamber; (c) forming a first film on the metal-element-containing film, by supplying a first process gas, which does not include an oxidizing gas, to the substrate under the second temperature in the process chamber; and (d) forming a second film on the first film such that the second film is thicker than the first film, by supplying a second process gas, which includes an oxidizing gas, to the substrate under a third temperature higher than the first temperature in the process chamber.

21 Claims, 7 Drawing Sheets

(51) Int. Cl.
  *C23C 16/32* (2006.01)
  *C23C 16/34* (2006.01)
  *C23C 16/36* (2006.01)
  *C23C 16/46* (2006.01)
  *C23C 16/52* (2006.01)

(52) U.S. Cl.
  CPC ............ C23C 16/345 (2013.01); C23C 16/36 (2013.01); C23C 16/46 (2013.01); C23C 16/52 (2013.01); H01L 21/0214 (2013.01); H01L 21/0217 (2013.01); H01L 21/0228 (2013.01); H01L 21/02167 (2013.01); H01L 21/02301 (2013.01); H01L 21/02323 (2013.01); H01L 21/02326 (2013.01); H01L 21/02211 (2013.01)

(58) Field of Classification Search
  CPC ........... H01L 21/0228; H01L 21/02301; H01L 21/02323; H01L 21/02326; H01L 21/02211; H01L 21/67103; H01L 21/02126; H01L 21/02312; H01L 21/205; H01L 21/67; H01L 45/1683; H01L 45/1253; H01L 45/1233; H01L 45/06; H01L 45/144; C23C 16/308; C23C 16/325; C23C 16/345; C23C 16/36; C23C 16/46; C23C 16/52; C23C 16/0218; C23C 16/401; C23C 16/45531
  See application file for complete search history.

(56) References Cited

U.S. PATENT DOCUMENTS

| | | | | |
|---|---|---|---|---|
| 9,659,998 B1* | 5/2017 | Lung | ................... | H10N 70/021 |
| 9,899,372 B1* | 2/2018 | Bi | ........................ | H01L 28/82 |
| 10,395,984 B2* | 8/2019 | Backes | ................ | H01L 23/528 |
| 10,505,111 B1* | 12/2019 | Ok | ..................... | H01L 21/7682 |
| 10,510,951 B1* | 12/2019 | Yu | ....................... | H10N 70/801 |
| 2007/0215852 A1* | 9/2007 | Lung | ................. | H10N 70/8413 |
| | | | | 257/4 |
| 2007/0232015 A1* | 10/2007 | Liu | ...................... | H10N 70/011 |
| | | | | 257/E21.589 |
| 2008/0061282 A1* | 3/2008 | Sato | ..................... | H10N 70/011 |
| | | | | 438/102 |
| 2008/0116437 A1* | 5/2008 | Oh | ..................... | H10N 70/8828 |
| | | | | 257/E47.001 |
| 2008/0197335 A1* | 8/2008 | Yu | ..................... | H10N 70/8265 |
| | | | | 438/102 |
| 2008/0280390 A1* | 11/2008 | Kim | ....................... | H10B 63/30 |
| | | | | 438/95 |
| 2008/0303014 A1* | 12/2008 | Goux | ................... | H10N 70/043 |
| | | | | 438/102 |
| 2011/0155993 A1* | 6/2011 | Chen | ................. | H10N 70/8828 |
| | | | | 438/102 |
| 2011/0256733 A1 | 10/2011 | Hirose et al. | | |
| 2012/0119177 A1* | 5/2012 | Erbetta | .............. | H10N 70/8828 |
| | | | | 257/E21.52 |
| 2012/0305872 A1* | 12/2012 | Yoon | .................... | H10N 70/882 |
| | | | | 257/532 |
| 2013/0149873 A1 | 6/2013 | Hirose et al. | | |
| 2014/0051260 A1 | 2/2014 | Sasajima et al. | | |
| 2014/0080314 A1 | 3/2014 | Sasajima et al. | | |
| 2014/0138604 A1* | 5/2014 | Liu | ...................... | H10N 70/231 |
| | | | | 257/4 |
| 2017/0062714 A1* | 3/2017 | Kau | ................... | H10N 70/8616 |
| 2018/0342390 A1* | 11/2018 | Xiao | ................. | H01L 21/02277 |
| 2019/0088474 A1* | 3/2019 | MacDonald | .............. | C07F 7/10 |
| 2019/0189688 A1* | 6/2019 | Lille | ..................... | H10N 70/826 |
| 2020/0010954 A1* | 1/2020 | Bhuyan | ................. | C23C 16/401 |
| 2020/0152870 A1* | 5/2020 | Lin | ...................... | H10N 70/023 |
| 2020/0194670 A1* | 6/2020 | Allegra | ................ | H10N 70/841 |
| 2020/0219933 A1* | 7/2020 | Cheng | ................. | H10N 70/841 |
| 2021/0098532 A1* | 4/2021 | Wu | ..................... | H10N 70/826 |
| 2022/0044929 A1* | 2/2022 | Xiao | ................. | H01L 21/02222 |

FOREIGN PATENT DOCUMENTS

| | | |
|---|---|---|
| JP | 2014-038923 A | 2/2014 |
| JP | 2014-060302 A | 4/2014 |

* cited by examiner

FIG. 8

| | Ramp-up + H₂ pre-flow | Thickness of SiN film(nm) | Thickness of SiOCN film(nm) | (Thickness of W layer /thickness of W film) × 100% | (Thickness of WO layer /thickness of W film) × 100% |
|---|---|---|---|---|---|
| Initial state | — | — | — | 70 | 30 |
| Sample 1 | Performed | 0 | 7 | 98.84 | 1.16 |
| Sample 2 | Performed | 0.16 | 6.84 | 100 | 0 |
| Sample 3 | Performed | 0.32 | 6.68 | 100 | 0 |
| Sample 4 | Performed | 0.48 | 6.52 | 100 | 0 |
| Sample 5 | Performed | 1.00 | 6.00 | 100 | 0 |

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2019/008550, filed on Mar. 5, 2019, the entire content of which is incorporated herein by reference.

TECHNICAL FIELD

The present disclosure relates to a method of manufacturing a semiconductor device, a method of processing a substrate, a substrate processing apparatus, and a recording medium.

BACKGROUND

As a process of manufacturing a semiconductor device, a process of forming a low dielectric constant film on a heated substrate by supplying a process gas including an oxidizing gas to the substrate may be performed.

SUMMARY

The present disclosure provides some embodiments of a technique capable of suppressing an oxidation of a film formed on a substrate when a base of the film is a metal-element-containing film, while the film is a low dielectric constant film.

According to one or more embodiments of the present disclosure, there is provided a technique that includes: (a) loading a substrate where a conductive metal-element-containing film is exposed on a surface of the substrate into a process chamber under a first temperature; (b) supplying a reducing gas to the substrate while raising a temperature of the substrate to a second temperature higher than the first temperature in the process chamber; (c) forming a first film, which contains silicon and at least one selected from the group of nitrogen and carbon and does not contain oxygen, on the metal-element-containing film, by supplying a first process gas, which does not include an oxidizing gas, to the substrate under the second temperature in the process chamber; and (d) forming a second film, which contains silicon, oxygen, carbon, and nitrogen, on the first film such that the second film is thicker than the first film, by supplying a second process gas, which includes an oxidizing gas, to the substrate under a third temperature higher than the first temperature in the process chamber.

BRIEF DESCRIPTION OF DRAWINGS

FIG. 8 is a diagram showing the evaluation results regarding an oxidation-suppressing effect of the W film by performing the first film formation before the second film formation.

DETAILED DESCRIPTION

One or More Embodiments of the Present Disclosure

One or more embodiments of the present disclosure will be now described mainly with reference to FIGS. 1 to 7D.

(1) Configuration of Substrate Processing Apparatus

Figure 1:
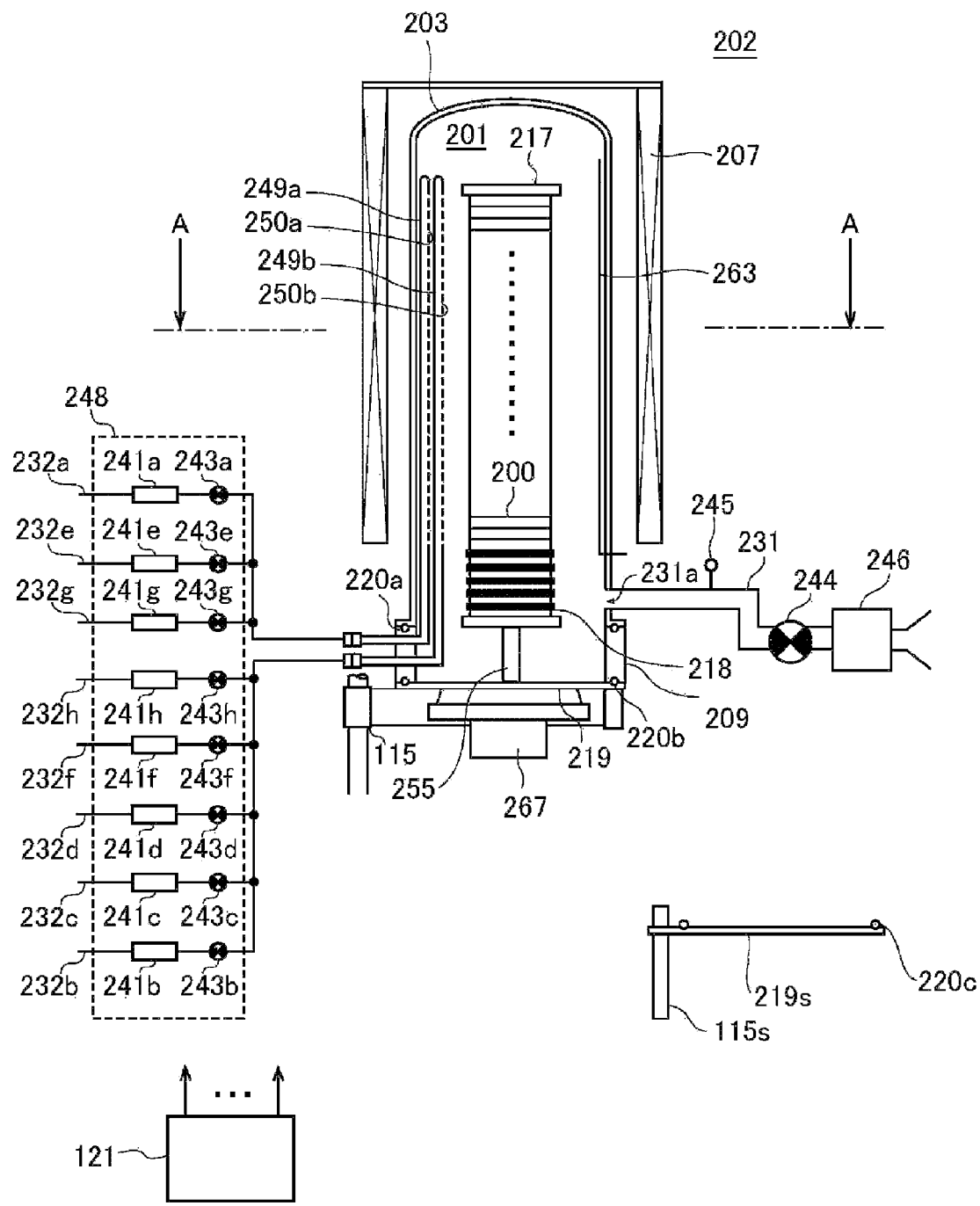
FIG. 1 is a schematic configuration view of a vertical process furnace of a substrate processing apparatus suitably used in one or more embodiments of the present disclosure, in which a portion of the process furnace is shown in a vertical cross section.

As shown in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate wafers 200 as substrates. Process to the wafers 200 is performed in the process chamber 201.

Nozzles 249a and 249b serving as first and second supply parts, respectively, are installed in the process chamber 201 so as to penetrate through a sidewall of the manifold 209. The nozzles 249a and 249b are also referred to as first and second nozzles, respectively. The nozzles 249a and 249b are made of a non-metal material which is a heat resistant material such as quartz or SiC. The nozzles 249a and 249b are configured as common nozzles to be used for supplying a plurality of types of gases, respectively.

Gas supply pipes 232a and 232b serving as first and second pipes, respectively, are connected to the nozzles 249a and 249b, respectively. The gas supply pipes 232a and 232b are configured as common pipes to be used for supplying a plurality of types of gases, respectively. Mass flow controllers (MFCs) 241a and 241b, which are flow rate controllers (flow rate control parts), and valves 243a and 243b, which are opening/closing valves, are installed in the gas supply pipes 232a and 232b, respectively, sequentially from the upstream side of a gas flow. Gas supply pipes 232e and 232g are connected to the gas supply pipe 232a at the downstream side of the valves 243a. MFCs 241e and 241g and valves 243e and 243g are installed in the gas supply pipes 232e and 232g, respectively, sequentially from the upstream side of a gas flow. Gas supply pipes 232c, 232d, 232f, and 232h are connected to the gas supply pipe 232b at the downstream side of the valves 243b. MFCs 241c, 241d, 241f, and 241h and valves 243c, 243d, 243f, and 243h are installed in the gas supply pipes 232c, 232d, 232f, and 232h, respectively, sequentially from the upstream side of a gas flow. The gas supply pipes 232a to 232h are made of, for example, a metal material such as SUS.

Figure 2:
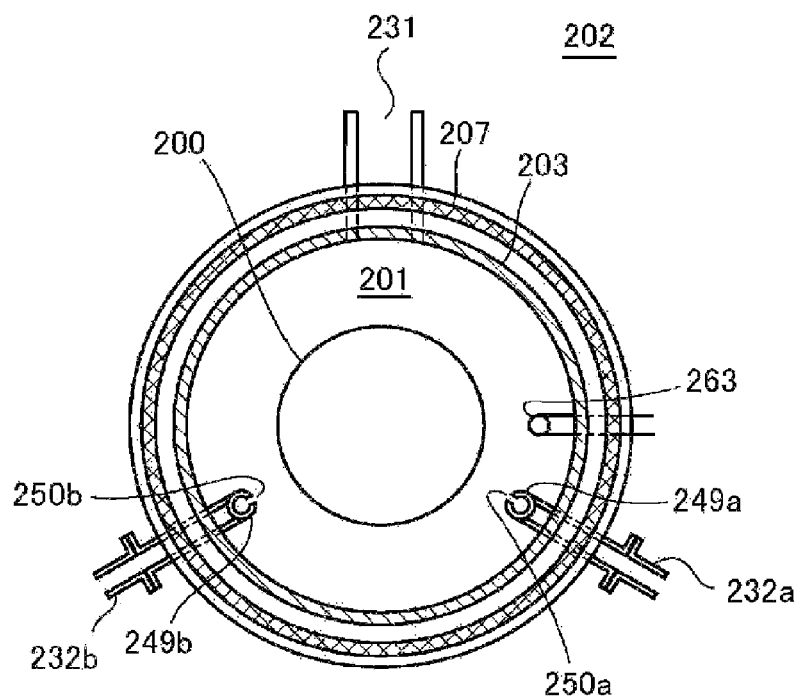
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249a and 249b is disposed in an annular space in a plane view between an inner wall of the reaction tube 203 and the wafers 200 so as to extend upward from a lower portion of the inner wall of the reaction tube 203 to an upper portion thereof, that is, along an arrangement direction of the wafers 200. Specifically, each of the nozzles 249a and 249b is installed in a region horizontally surrounding a wafer arrangement region in which the wafers 200 are arranged at a lateral side of the wafer arrangement region, along the wafer arrangement region. Gas supply holes 250a and 250b for supplying a gas are installed on the side surfaces of the nozzles 249a and 249b, respectively. Each of the gas supply holes 250a and 250b is opened toward the centers of the wafer 200s in a plane view, which enables a gas to be supplied toward the wafers 200. A plurality of gas supply holes 250a and 250b are installed from the lower portion of the reaction tube 203 to the upper portion thereof.

A precursor gas, for example, a halosilane-based gas containing silicon (Si), which is a main element (predetermined element) constituting a film, and a halogen element is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state at room temperature and atmospheric pressure, or a precursor which remains in a gas state at room temperature and atmospheric pressure. Halosilane is a silane including a halogeno group (halogen group). The halogeno group includes a chloro group, a fluoro group, a bromo group, an iodine group, and the like. That is, the halogeno group contains chlorine (Cl), fluorine (F), bromine (Br), iodine (I), and the like. An example of the halosilane-based gas may include a precursor gas containing Si and Cl, that is, a chlorosilane-based gas. An example of the chlorosilane-based gas may include a hexachlorodisilane ($Si_2Cl_6$, abbreviation: HCDS) gas. The HCDS gas acts as a Si source.

A reaction gas, for example, a nitrogen (N)- and hydrogen (H)-containing gas, is supplied from the gas supply pipe 232b into the process chamber 201 via the MFC 241b, the valve 243b, and the nozzle 249b. An example of the N- and H-containing gas may include an ammonia ($NH_3$) gas which is a hydronitrogen-based gas. The $NH_3$ gas acts as a nitriding gas, that is, a N source.

A reaction gas, for example, a carbon (C)-containing gas, is supplied from the gas supply pipe 232c into the process chamber 201 via the MFC 241c, the valve 243c, the gas supply pipe 232b, and the nozzle 249b. An example of the C-containing gas may include a propylene ($C_3H_6$) gas which is a hydrocarbon-based gas. The $C_3H_6$ gas acts as a C source.

A reaction gas, for example, an oxygen (O)-containing gas, is supplied from the gas supply pipe 232d into the process chamber 201 via the MFC 241d, the valve 243d, the gas supply pipe 232b, and the nozzle 249b. An example of the O-containing gas may include an oxygen ($O_2$) gas. The $O_2$ gas acts as an oxidizing gas, that is, an O source.

A reducing gas, for example, a hydrogen ($H_2$) gas, which is a H-containing gas, is supplied from the gas supply pipes 232e and 232f into the process chamber 201 via the MFCs 241e and 241f, the valves 243e and 243f, the gas supply pipes 232a and 232b, and the nozzles 249a and 249b, respectively.

An inert gas, for example, a nitrogen ($N_2$) gas, is supplied from the gas supply pipes 232g and 232h into the process chamber 201 via the MFCs 241g and 241h, the valves 243g and 243h, the gas supply pipes 232a and 232b, and the nozzles 249a and 249b, respectively. The $N_2$ gas acts as a purge gas, a carrier gas, a dilution gas, or the like.

A precursor gas supply system (Si source supply system) mainly includes the gas supply pipe 232a, the MFC 241a, and the valve 243a. A reaction gas supply system (N source supply system, C source supply system, and O source supply system) mainly includes the gas supply pipes 232b to 232d, the MFCs 241b to 241d, and the valves 243b to 243d. A reducing gas supply system mainly includes the gas supply pipes 232e and 232f, the MFCs 241e and 241f, and the valves 243e and 243f. An inert gas supply system mainly includes the gas supply pipes 232g and 232h, the MFCs 241g and 241h, and the valves 243g and 243h.

The precursor gas and the reaction gas to be used in first film formation, which will be described later, are also collectively referred to as a first process gas. Further, the precursor gas supply system and the reaction gas supply system to be used in the first film formation are also collectively referred to as a first process gas supply system. Further, the precursor gas and the reaction gas to be used in second film formation, which will be described later, are also collectively referred to as a second process gas. Further, the precursor gas supply system and the reaction gas supply system to be used in the second film formation are also collectively referred to as a second process gas supply system.

One or all of the above-described various supply systems may be configured as an integrated-type supply system 248 in which the valves 243a to 243h, the MFCs 241a to 241h, and so on are integrated. The integrated-type supply system 248 is connected to each of the gas supply pipes 232a to 232h. In addition, the integrated-type supply system 248 is configured such that operations of supplying various gases into the gas supply pipes 232a to 232h (that is, the opening/closing operation of the valves 243a to 243h, the flow rate adjustment operation by the MFCs 241a to 241h, and the like) are controlled by a controller 121 which will be described later. The integrated-type supply system 248 is configured as an integral type or detachable type integrated unit, and may be attached to and detached from the gas supply pipes 232a to 232h and the like on an integrated unit basis, so that the maintenance, replacement, extension, etc. of the integrated-type supply system 248 can be performed on an integrated unit basis.

An exhaust port 231a for exhausting an internal atmosphere of the process chamber 201 is installed below the sidewall of the reaction tube 203. The exhaust port 231a may be installed from a lower portion of the sidewall of the reaction tube 203 to an upper portion thereof, that is, along the wafer arrangement region. An exhaust pipe 231 is connected to the exhaust port 231a. A vacuum exhaust device, for example, a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is made of, for example, a metal material such as SUS, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267 is connected to the boat 217 via the seal cap 219. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer system (transfer mechanism) which loads/unloads (transfers) the wafers 200 into/out of the process chamber 201 by moving the seal cap 219 up and down. A shutter 219s, which serves as a furnace opening cover configured to hermetically seal a lower end opening of the manifold 209 in a state where the seal cap 219 is lowered and the boat 217 is unloaded from an interior of the process chamber 201, is installed under the manifold 209. The shutter 219s is made of, for example, a metal material such as SUS, and is formed in a disc shape. An O-ring 220c, which is a seal member making contact with the lower end portion of the manifold 209, is installed on an upper surface of the shutter 219s. The opening/closing operation (such as elevation operation, rotation operation, or the like) of the shutter 219s is controlled by a shutter-opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat-insulating plates 218 made of a heat resistant material such as quartz or SiC are supported below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
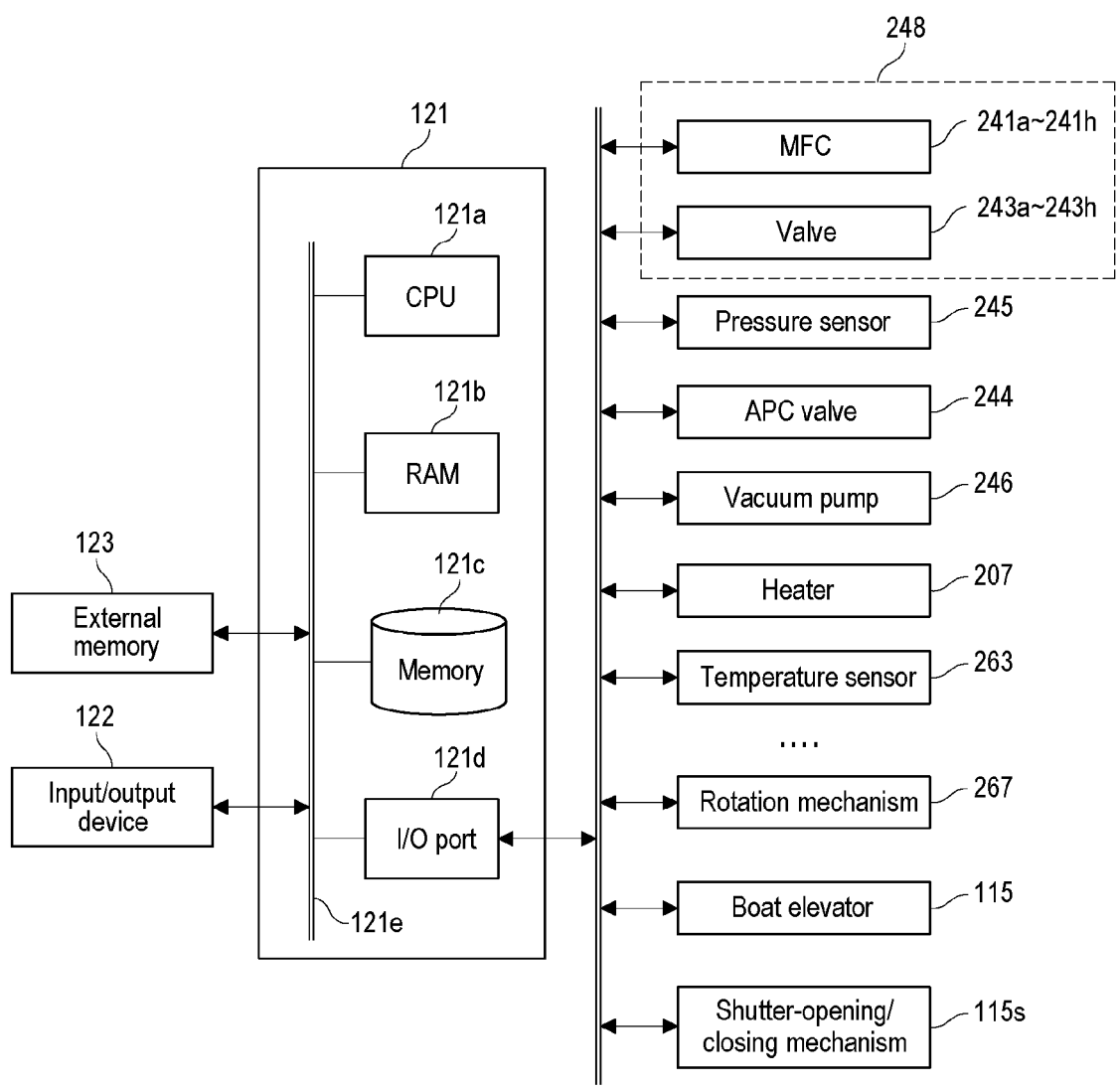
FIG. 3 is a schematic configuration diagram of a controller of the substrate processing apparatus suitably used in the embodiments of the present disclosure, in which a control system of the controller is shown in a block diagram.

As shown in FIG. 3, a controller 121, which is a control part (control means), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121.

The memory 121c is configured by, for example, a flash memory, a hard disk drive (HDD), or the like. A control program for controlling operations of a substrate processing apparatus, a process recipe in which sequences and conditions of substrate processing to be described later are written, etc. are readably stored in the memory 121c. The process recipe functions as a program for causing the controller 121 to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter-opening/closing mechanism 115s, and so on.

The CPU 121a is configured to read and execute the control program from the memory 121c and is also configured to read the recipe from the memory 121c according to an input of an operation command from the input/output device 122. The CPU 121a is configured to control the flow-rate-adjusting operation of various kinds of gases by the MFCs 241a to 241h, the opening/closing operation of the valves 243a to 243h, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operations of rotating the boat 217 and adjusting the rotation speed of the boat 217 with the rotation mechanism 267, the operation of moving the boat 217 up and down by the boat elevator 115, the opening/closing operation of the shutter 219s by the shutter-opening/closing mechanism 115s, and so on, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory, and the like. The memory 121c or the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer using communication means such as the Internet or a dedicated line, instead of using the external memory 123.

(2) Substrate-Processing Process

As a process of manufacturing a semiconductor device using the above-described substrate processing apparatus, a substrate-processing sequence example of removing a native oxide film formed on the surface of a conductive metal-element-containing film (hereinafter also simply referred to as a metal-containing film) exposed on a wafer 200 as a substrate and then forming a low dielectric constant film on the metal-containing film while suppressing oxidation of the metal-containing film will be described mainly with reference to FIGS. 4 to 7D. In the following descriptions, the operations of the respective parts constituting the substrate processing apparatus are controlled by the controller 121.

Figure 4:
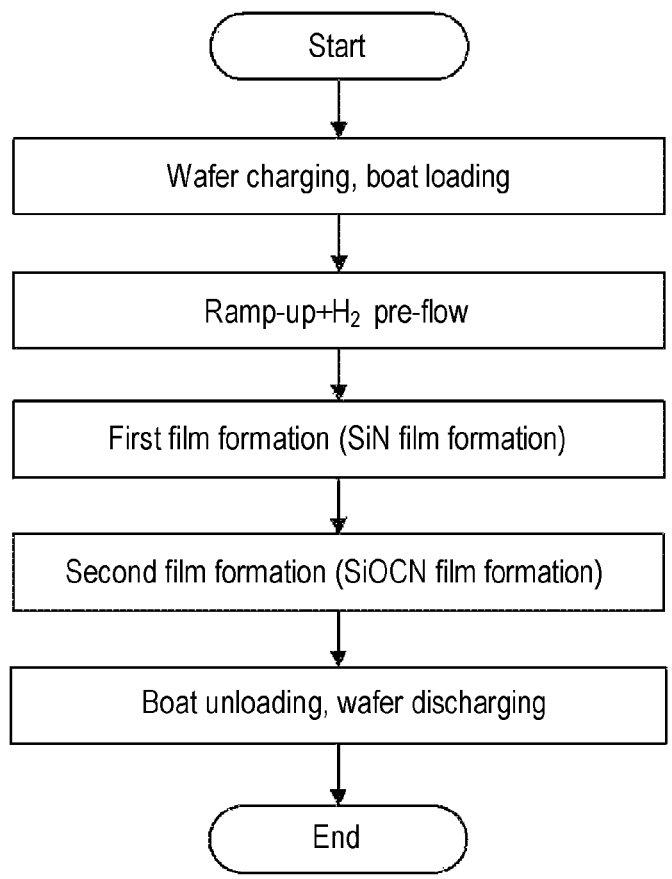
FIG. 4 is a diagram showing a substrate-processing sequence according to one or more embodiments of the present disclosure.

The substrate-processing sequence shown in FIG. 4 includes:
  a step of loading a wafer 200 having a tungsten (W) film as a conductive metal-element-containing film exposed on the surface of the wafer 200 into a process chamber 201 under a first temperature (wafer charging and boat loading);
  a step of supplying a $H_2$ gas as a reducing gas to the wafer 200 while raising the temperature of the wafer 200 to a second temperature higher than the first temperature in the process chamber 201 (ramp-up+$H_2$ pre-flow);
  a step of forming a silicon nitride film (SiN film) as a first film containing Si and at least one selected from the group of N and C and not containing O on the W film by supplying a HCDS gas and an $NH_3$ gas as a first process gas including no oxidizing gas to the wafer 200 in the process chamber 201 under the second temperature (first film formation); and
  a step of forming a silicon oxycarbonitride film (SiOCN film) as a second film containing Si, O, C, and N, which is thicker than the SiN film, on the SiN film by supplying a HCDS gas, an $O_2$ gas, a $C_3H_6$ gas, and an $NH_3$ gas as a second process gas including an oxidizing gas to the wafer 200 in the process chamber 201 under a third temperature higher than the first temperature (second film formation).

In the first film formation described above, a cycle which includes supplying the HCDS gas and the $NH_3$ gas to the wafer 200 is performed a predetermined number of times. In a gas-supplying sequence shown in FIG. 5, in the first film formation, a sequence example of performing a cycle m times (where m is an integer of 1 or more and 3 or less), the cycle including intermittently and non-simultaneously supplying the HCDS gas and the $NH_3$ gas to the wafer 200, is shown.

Further, in the second film formation described above, a cycle which includes supplying the HCDS gas, the $O_2$ gas, the $C_3H_6$ gas, and the $NH_3$ gas to the wafer 200 is performed a predetermined number of times. In a gas-supplying sequence shown in FIG. 6, in the second film formation, a sequence example of performing a cycle n times (where n is an integer of 1 or more), the cycle including intermittently and non-simultaneously supplying the HCDS gas, the $O_2$ gas, the $C_3H_6$ gas, and the $NH_3$ gas to the wafer 200, is shown.

Figure 5:
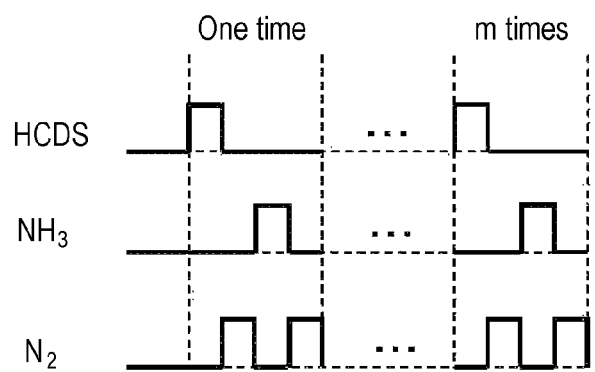
FIG. 5 is a diagram showing a gas-supplying sequence in first film formation according to one or more embodiments of the present disclosure.

In the present disclosure, the gas-supplying sequence of the first film formation shown in FIG. 5 and the gas-supplying sequence of the second film formation shown in FIG. 6 may be denoted as follows for the sake of convenience. The same notation will be used in the following description of other embodiments.

$(HCDS \rightarrow NH_3) \times m \Rightarrow SiN$

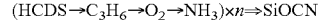

$(HCDS \rightarrow C_3H_6 \rightarrow O_2 \rightarrow NH_3) \times n \Rightarrow SiOCN$ When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219s is moved by the shutter-opening/closing mechanism 115s and the lower end opening of the manifold 209 is opened (shutter open). Thereafter, as shown in FIG. 1, the boat 217 supporting the wafers 200 is lifted up by the boat elevator 115 to be loaded into the process chamber 201 (boat loading). In this state, the seal cap 219 seals the lower end of the manifold 209 via the O-ring 220b.

Figure 7A:
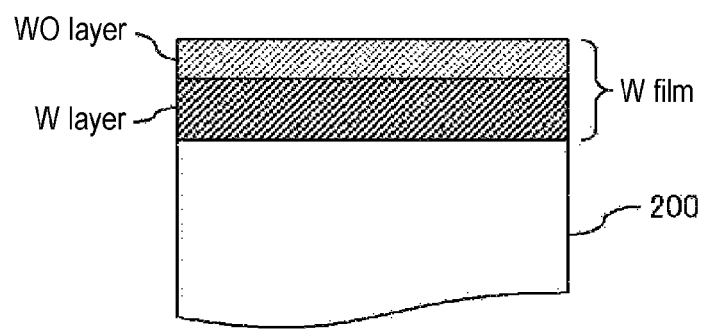
FIG. 7A is an enlarged cross-sectional view of the surface of a target wafer having a W film exposed on the surface of the wafer.

As a wafer 200, for example, a Si substrate composed of single crystal Si or a substrate having a single crystal Si film formed on the surface of the substrate can be used. As shown in FIG. 7A, a W film, which is a conductive metal-element-containing film, is installed in at least a portion of the surface of the wafer 200, and at least a portion of the W film is exposed. A native oxide layer may be formed on the exposed surface of the W film. In the W film, the ratio (%) of the thickness of a W layer, which is a portion where the native oxide layer is not formed (not oxidized), and the thickness of a layer having the composition of WO, (hereinafter also simply referred to as a WO layer), which is a portion where the native oxide layer is formed (oxidized), is, for example, about 70:30.

When the boat is loaded, in order to suppress the oxidation of the W film, that is, in order to suppress formation of a further WO layer on the surface of the W film, increase in the thickness of the already-formed WO layer, etc., it is preferable that the internal temperature of the process chamber 201 is set to a predetermined first temperature, that is, a predetermined temperature within a range of room temperature (25 degrees C.) or higher and 200 degrees C. or lower, specifically room temperature or higher and 150 degrees C. or lower. When the internal temperature of the process chamber 201 exceeds 200 degrees C., oxidation of the W film may proceed due to the influence of the moisture infiltrated into the process chamber 201 when the boat is loaded, the moisture remaining in the process chamber 201 before the boat loading, etc. By setting the internal temperature of the process chamber 201 to 200 degrees C. or lower, it is less susceptible to the influence of the moisture infiltrated into the process chamber 201, the moisture remaining in the process chamber 201, etc., which makes it possible to avoid the oxidation of the W film. By setting the internal temperature of the process chamber 201 to 150 degrees C. or lower, it is possible to reliably avoid the oxidation of the W film when the boat is loaded. When the internal temperature of the process chamber 201 is lower than the room temperature, a cooling device for cooling the interior of the process chamber 201 may be required, and the subsequent temperature-rising time becomes long. As a result, the apparatus costs may increase and the productivity may decrease. By setting the internal temperature of the process chamber 201 to the room temperature or higher, a cooling device for cooling the interior of the process chamber 201 may not be required, and the subsequent temperature-rising time can be shortened. As a result, it is possible to reduce the apparatus costs and improve the productivity.

Further, when the boat is loaded, the valves 243g and 243h are opened to allow a $N_2$ gas to be supplied into the process chamber 201 via the nozzles 249a and 249b to purge the interior of the process chamber 201 with the $N_2$ gas. As a result, it is possible to prevent the infiltration of water and the like into the process chamber 201, promote the discharge of the residual water and the like from the interior of the process chamber 201, etc. The supply flow rate of the $N_2$ gas (for each gas supply pipe) is a flow rate within a range of, for example, 0.5 to 20 slm.

As an inert gas, in addition to the $N_2$ gas, a rare gas such as an Ar gas, a He gas, a Ne gas, a Xe gas, or the like can be used. The same applies to each step to be described later.
(Ramp-Up+$H_2$ Pre-Flow)

After the boat load is completed, the interior of the process chamber 201 is vacuum-exhausted (depressurization-exhausted) by the vacuum pump 246 to reach a desired pressure (pressure adjustment). Further, the wafer 200 in the process chamber 201 is heated to rise in temperature by the heater 207 to reach a desired second temperature higher than the first temperature (ramp-up). Further, the rotation mechanism 267 starts to rotate the wafer 200 (rotation). The exhaust of the interior of the process chamber 201 and the heating and rotation of the wafer 200 are continuously performed at least until the process to the wafer 200 is completed.

Then, in parallel with the ramp-up (temperature rise) of the wafer 200, $H_2$ pre-flow is performed. That is, the valves 243e and 243f are opened to allow a $H_2$ gas to flow into the gas supply pipes 232e and 232f The flow rate of the $H_2$ gas is adjusted by the MFC 241e and 241f, and the $H_2$ gas is supplied into the process chamber 201 via the nozzles 249a and 249b and is exhausted through the exhaust port 231a. In this operation, the $H_2$ gas is supplied to the wafer 200 ($H_2$ pre-flow). At this time, the valves 243g and 243h may be opened to allow a $N_2$ gas to be supplied into the process chamber 201 via the nozzles 249a and 249b.

The process conditions of this step are exemplified as follows.

$H_2$ gas supply flow rate (for each gas supply pipe): 1 to 10 slm $N_2$ gas supply flow rate (for each gas supply pipe): 1 to 10 slm Each gas supply time: 1 to 120 minutes, specifically 1 to 60 minutes Temperature-rising start temperature (first temperature): room temperature to 200 degrees C., specifically room temperature to 150 degrees C.

Temperature-rising target temperature (second temperature): 500 to 800 degrees C., specifically 600 to 700 degrees C.

Temperature-rising rate: 1 to 30 degrees C./min, specifically 1 to 20 degrees C./min Processing pressure: 20 to 10,000 Pa, specifically 1,000 to 5,000 Pa The temperature-rising target temperature is also the processing temperature in the first film formation to be described later.

Figure 7B:
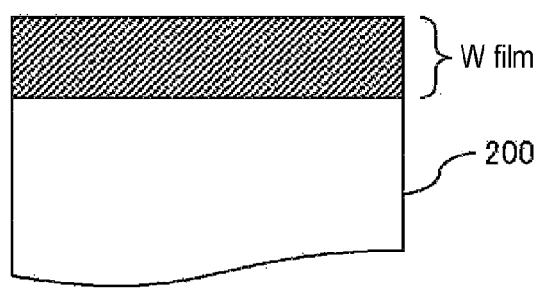
FIG. 7B is an enlarged cross-sectional view on the surface of the wafer after a ramp-up+$H_2$ pre-flow is performed to remove a native oxide layer from the surface of the W film.

By supplying the $H_2$ gas to the wafer 200 while raising the temperature of the wafer 200 under the aforementioned conditions, that is, by raising the temperature of the wafer 200 under the $H_2$ gas atmosphere, it is possible to reduce a portion of the W film, which is exposed to the surface of the wafer 200 to remove the WO layer formed on the surface of the W film, as shown in FIG. 7B. The O component contained in the WO layer constitutes a gaseous substance containing at least O in the process of a reaction that occurs when the WO layer is removed, and is discharged from the process chamber 201. Further, in this step, by raising the temperature of the wafer 200 under the $H_2$ gas atmosphere, it is possible to prevent the oxidation of the surface of the W film after the WO layer is removed.

If the second temperature is lower than 500 degrees C., the effect of removing the WO layer by the reduction reaction described above and the effect of preventing the oxidation of the surface of the W film after removing the WO layer may be insufficient. By setting the second temperature to a temperature of 500 degrees C. or higher, these effects can be sufficiently obtained. By setting the second temperature to a temperature of 600 degrees C. or higher, these effects can be surely obtained.

If the second temperature exceeds 800 degrees C., an excessive vapor phase reaction may occur in the process chamber 201 in the first film formation to be described later, which may deteriorate the film thickness uniformity of the film formed on the wafer 200, thereby deteriorating the quality of the film. By setting the second temperature to 800 degrees C. or lower, this problem can be solved. By setting the second temperature to 700 degrees C. or lower, this problem can be surely solved.

As a reducing gas, a deuterium ($D_2$) gas can be used in addition to the $H_2$ gas.

After the removal of the WO layer from the surface of the W film is completed, the valves 243e and 243f are closed to stop the supply of the $H_2$ gas into the process chamber 201. Then, the interior of the process chamber 201 is vacuum-exhausted to remove a gas and the like remaining in the process chamber 201 from the interior of the process chamber 201 (purge). At this time, the valves 243g and 243h are opened to allow a $N_2$ gas to be supplied into the process chamber 201. The $N_2$ gas acts as a purge gas. Even after the removal of the WO layer from the surface of the W film is completed, the supply of the $H_2$ gas into the process chamber 201 may be continued (maintained) for a predetermined period until the first film formation is started. For example, even after the temperature rise of the wafer 200 to the second temperature is completed, the supply of the H$_2$ gas into the process chamber 201 may be continued for a predetermined period until the first film formation is started. In this case, the effect of preventing the oxidation of the surface of the W film after the WO layer is removed can be continued for a predetermined period until the first film formation is started.

(First Film Formation)

After that, the next steps C1 and C2 are sequentially executed.

[Step C1]

In this step, a HCDS gas is supplied to the wafer 200 in the process chamber 201 (HCDS gas supply). Specifically, the valve 243a is opened to allow the HCDS gas to flow into the gas supply pipe 232a. The flow rate of the HCDS gas is adjusted by the MFC 241a, and the HCDS gas is supplied into the process chamber 201 via the nozzle 249a and is exhausted through the exhaust port 231a. In this operation, the HCDS gas is supplied to the wafer 200. At this time, the valves 243g and 243h may be opened to allow a N$_2$ gas to be supplied into the process chamber 201 via the nozzles 249a and 249b.

The process conditions of this step are exemplified as follows
- HCDS gas supply flow rate: 0.01 to 2 slm, specifically 0.1 to 1 slm
- N$_2$ gas supply flow rate (for each gas supply pipe): 0 to 10 slm
- Each gas supply time: 1 to 120 seconds, specifically 1 to 60 seconds
- Processing temperature (second temperature): 500 degrees C. to 800 degrees C., specifically 600 degrees C. to 700 degrees C.
- Processing pressure: 1 to 2,666 Pa, specifically 67 to 1,333 Pa By supplying the HCDS gas to the wafer 200 under the aforementioned conditions, a Si-containing layer containing Cl is formed on the outermost surface of the wafer 200. The Si-containing layer containing Cl is formed by Si deposition or the like on the outermost surface of the wafer 200 by physical adsorption of HCDS, chemical adsorption of a substance (hereinafter, Si$_x$Cl$_y$) obtained when a portion of HCDS is decomposed, thermal decomposition of HCDS, and the like. The Si-containing layer containing Cl may be an adsorption layer (physical adsorption layer or chemical adsorption layer) of HCDS or Si$_x$Cl$_y$, or may be a Si deposition layer containing Cl. In the present disclosure, the Si-containing layer containing Cl is also simply referred to as a Si-containing layer.

After the Si-containing layer is formed, the valve 243a is closed to stop the supply of the HCDS gas into the process chamber 201. Then, the interior of the process chamber 201 is vacuum-exhausted to remove a gas and the like remaining in the process chamber 201 from the interior of the process chamber 201. At this time, the valves 243g and 243h are opened to allow a N$_2$ gas to flow into the process chamber 201. The N$_2$ gas acts as a purge gas.

As a precursor gas, in addition to the HCDS gas, it may be possible to use, e.g., a chlorosilane-based gas such as a monochlorosilane (SiH$_3$Cl, abbreviation: MCS) gas, a dichlorosilane (SiH$_2$Cl$_2$, abbreviation: DCS) gas, a trichlorosilane (SiHCl$_3$, abbreviation: TCS) gas, a tetrachlorosilane (SiCl$_4$, abbreviation: STC) gas, or an octachlorotrisilane (Si$_3$Cl$_8$, abbreviation: OCTS) gas. The same applies to step D1 to be described later.

[Step C2]

After step C1 is completed, an NH$_3$ gas is supplied to the wafer 200 in the process chamber 201, that is, the Si-containing layer formed on the wafer 200 (NH$_3$ gas supply). Specifically, the valve 243b is opened to allow the NH$_3$ gas to flow into the gas supply pipe 232b. The flow rate of the NH$_3$ gas is adjusted by the MFC 241b, and the NH$_3$ gas is supplied into the process chamber 201 via the nozzle 249b and is exhausted through the exhaust port 231a. In this operation, the NH$_3$ gas is supplied to the wafer 200. At this time, the valves 243g and 243h may be opened to allow a N$_2$ gas to be supplied into the process chamber 201 via the nozzles 249a and 249b.

The process conditions of this step are exemplified as follows.
- NH$_3$ gas supply flow rate: 0.1 to 10 slm
- NH$_3$ gas supply time: 1 to 120 seconds, specifically 1 to 60 seconds
- Processing pressure: 1 to 4,000 Pa, specifically 1 to 3,000 Pa
- Other process conditions are the same as the process conditions in step C1.

By supplying the NH$_3$ gas to the wafer 200 under the aforementioned conditions, at least a portion of the Si-containing layer formed on the wafer 200 is nitrided (modified). By modifying the Si-containing layer, a layer containing Si and N, that is, a silicon nitride layer (SiN layer), is formed on the wafer 200. When forming the SiN layer, impurities such as Cl contained in the Si-containing layer constitute a gaseous substance containing at least Cl in the process of modifying the Si-containing layer with the NH$_3$ gas and are discharged from the interior of the process chamber 201. As a result, the SiN layer becomes a layer having fewer impurities such as Cl than the Si-containing layer formed in step C1.

After the SiN layer is formed, the valve 243b is closed to stop the supply of the NH$_3$ gas into the process chamber 201. Then, a gas and the like remaining in the process chamber 201 are removed from the process chamber 201 according to the same processing procedure as in the purge in step C1 (purge).

As a reaction gas (N- and H-containing gas), in addition to the NH$_3$ gas, it may be possible to use, e.g., a hydrogen nitride-based gas such as a diazene (N$_2$H$_2$) gas, a hydrazine (N$_2$H$_4$) gas, or a N$_3$H$_8$ gas. The same applies to step D4 to be described later.

(Performing Predetermined Number of Times)

Figure 7C:
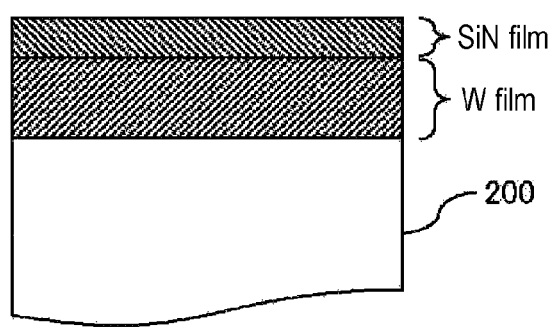
FIG. 7C is an enlarged cross-sectional view on the surface of the wafer after first film formation is performed to form a SiN film on the W film.

By performing a cycle a predetermined number of times (m times, where m is an integer of 1 or more and 3 or less), the cycle including non-simultaneously, that is, without synchronization, performing the above-described steps 1 and 2, as shown in FIG. 7C, it is possible to form a SiN film having a predetermined composition and a predetermined film thickness on the wafer 200, that is, the W film from which the WO layer is removed by the temperature rise of the wafer 200 under the H$_2$ gas atmosphere.

The thickness of the SiN film is, for example, 0.16 nm or more and 1 nm or less, specifically 0.16 nm or more and 0.48 nm or less, and more specifically 0.16 nm or more and 0.32 nm or less.

If the thickness of the SiN film is less than 0.16 nm, the oxidation-blocking effect to be described later becomes insufficient, so that a portion of the W film may be oxidized in the second film formation to be described later. By setting the thickness of the SiN film to 0.16 nm or more, the oxidation-blocking effect can be sufficiently obtained, which makes it possible to avoid the oxidation of the W film in the second film formation to be described later.

If the thickness of the SiN film exceeds 1 nm, the total dielectric constant of a laminated film to be described later may increase. By setting the thickness of the SiN film to 1 nm or less, it is possible to suppress the increase in the total dielectric constant of the laminated film to be described later. By setting the thickness of the SiN film to 0.48 nm or less, this effect can be surely obtained, and by setting the thickness of the SiN film to 0.32 nm or less, this effect can be more surely obtained.

The above-mentioned cycle may be repeated multiple times. That is, the thickness of the SiN layer formed when the above-mentioned cycle is performed once may be set to be smaller than a desired film thickness, and the above-mentioned cycle may be repeated multiple times until the film thickness of a SiN film formed by laminating SiN layers reaches the desired film thickness. By setting the number of times of performing the above-mentioned cycle to a predetermined number of times of 1 or more and 3 or less, it is possible to set the thickness of the SiN film within the above-mentioned range.

(Second Film Formation)

After that, the next steps D1 to D4 are sequentially executed.

[Step D1]

In this step, a HCDS gas is supplied to the wafer 200 in the process chamber 201 according to the same processing procedure as the processing procedure in the above-described step C1 (HCDS gas supply).

The process conditions of this step are exemplified as follows.

HCDS gas supply flow rate: 0.01 to 2 slm, specifically 0.1 to 1 slm $N_2$ gas supply flow rate (for each gas supply pipe): 0 to 10 slm Each gas supply time: 1 to 120 seconds, specifically 1 to 60 seconds Processing temperature (third temperature): 250 degrees C. to 800 degrees C., specifically 400 degrees C. to 700 degrees C.

Processing pressure: 1 to 2,666 Pa, specifically 67 to 1,333 Pa

The third temperature may be a temperature higher than the above-mentioned first temperature. Further, the third temperature may be the same as the above-mentioned second temperature.

By supplying the HCDS gas to the wafer 200 under the aforementioned conditions, a Si-containing layer is formed on the wafer 200, that is, on the SiN film formed on the wafer 200.

After the Si-containing layer is formed, the supply of the HCDS gas into the process chamber 201 is stopped, and a gas and the like remaining in the process chamber 201 are removed from the process chamber 201 according to the same processing procedure as in the purge in step C1 (purge).

[Step D2]

After step D1 is completed, a $C_3H_6$ gas is supplied to the wafer 200 in the process chamber 201, that is, the Si-containing layer formed on the SiN film on the wafer 200 ($C_3H_6$ gas supply). Specifically, the valve 243c is opened to allow the $C_3H_6$ gas to flow into the gas supply pipe 232c. The flow rate of the $C_3H_6$ gas is adjusted by the MFC 241c, and the $C_3H_6$ gas is supplied into the process chamber 201 via the gas supply pipe 232b and the nozzle 249b and is exhausted through the exhaust port 231a. In this operation, the $C_3H_6$ gas is supplied to the wafer 200. At this time, the valves 243g and 243h may be opened to allow a $N_2$ gas to be supplied into the process chamber 201 via the nozzles 249a and 249b.

The process conditions of this step are exemplified as follows.

$C_3H_6$ gas supply flow rate: 0.1 to 10 slm $C_3H_6$ gas supply time: 1 to 120 seconds, specifically 1 to 60 seconds Processing pressure: 1 to 4,000 Pa, specifically 1 to 3,000 Pa Other process conditions are the same as the process conditions in step D1.

By supplying the $C_3H_6$ gas to the wafer 200 under the aforementioned conditions, a C-containing layer is formed on the Si-containing layer. As a result, a layer containing Si and C formed by laminating the C-containing layer on the Si-containing layer is formed on the wafer 200, that is, on the SiN film on the wafer 200.

After the layer containing Si and C is formed, the valve 243c is closed to stop the supply of the $C_3H_6$ gas into the process chamber 201. Then, a gas and the like remaining in the process chamber 201 are removed from the process chamber 201 according to the same processing procedure as in the purge in step C1 (purge).

As a reaction gas (C-containing gas), in addition to the $C_3H_6$ gas, it may be possible to use, e.g., a hydrocarbon-based gas such as an acetylene ($C_2H_2$) gas or an ethylene ($C_2H_4$) gas.

[Step D3]

After step D2 is completed, an $O_2$ gas is supplied to the wafer 200 in the process chamber 201, that is, the layer containing Si and C formed on the SiN film on the wafer 200 ($O_2$ gas supply). Specifically, the valve 243d is opened to allow the $O_2$ gas to flow into the gas supply pipe 232d. The flow rate of the $O_2$ gas is adjusted by the MFC 241d, and the $O_2$ is supplied into the process chamber 201 via the gas supply pipe 232b and the nozzle 249b and is exhausted through the exhaust port 231a. In this operation, the $O_2$ gas is supplied to the wafer 200. At this time, the valves 243g and 243h may be opened to allow a $N_2$ gas to be supplied into the process chamber 201 via the nozzles 249a and 249b.

The process conditions of this step are exemplified as follows.

$O_2$ gas supply flow rate: 0.1 to 10 slm $O_2$ gas supply time: 1 to 120 seconds, specifically 1 to 60 seconds Processing pressure: 1 to 4,000 Pa, specifically 1 to 3,000 Pa Other process conditions are the same as the process conditions in step D1.

By supplying the $O_2$ gas to the wafer 200 under the aforementioned conditions, at least a portion of the layer containing Si and C formed on the SiN film on the wafer 200 is oxidized (modified). By modifying the layer containing Si and C, a silicon oxycarbide layer (SiOC layer) is formed as a layer containing Si, O, and C on the wafer 200, that is, on the SiN film on the wafer 200. When the SiOC layer is formed, impurities such as Cl contained in the layer containing Si and C constitute a gaseous substance containing at least Cl in the process of modifying the layer containing Si and C with the $O_2$ gas and are discharged from the interior of the process chamber 201. As a result, the SiOC layer becomes a layer having fewer impurities such as Cl than the Si-containing layer formed in step D1 and the layer containing Si and C formed in step D2.

After the SiOC layer is formed, the valve 243d is closed to stop the supply of the $O_2$ gas into the process chamber

201. Then, a gas and the like remaining in the process chamber 201 are removed from the process chamber 201 according to the same processing procedure as in the purge in step C1 (purge).

As a reaction gas (O-containing gas), in addition to the $O_2$ gas, it may be possible to use, e.g., an ozone ($O_3$) gas, water vapor ($H_2O$ gas), a nitric oxide (NO) gas, or a nitrous oxide ($N_2O$) gas.

[Step D4]

After step D3 is completed, an $NH_3$ gas is supplied to the wafer 200 in the process chamber 201 according to the same processing procedure as the processing procedure in the above-described step C2 ($NH_3$ gas supply).

The process conditions of this step are exemplified as follows.

$NH_3$ gas supply flow rate: 0.1 to 10 slm $NH_3$ gas supply time: 1 to 120 seconds, specifically 1 to 60 seconds Processing pressure: 1 to 4,000 Pa, specifically 1 to 3,000 Pa Other process conditions are the same as the process conditions in step D1.

By supplying the $NH_3$ gas to the wafer 200 under the aforementioned conditions, at least a portion of the SiOC layer formed on the SiN film on the wafer 200 is nitrided (modified). By modifying the SiOC layer, a silicon oxycarbonitride layer (SiOCN layer) is formed as a layer containing Si, O, C, and N on the wafer 200, that is, on the SiN film on the wafer 200. When the SiOCN layer is formed, impurities such as Cl contained in the SiOC layer constitute a gaseous substance containing at least Cl in the process of modifying the SiOC layer with the $NH_3$ gas and are discharged from the interior of the process chamber 201. As a result, the SiOCN layer becomes a layer having fewer impurities such as Cl than the SiOC layer formed in step D3.

After the SiOCN layer is formed, the supply of the $NH_3$ gas into the process chamber 201 is stopped, and a gas and the like remaining in the process chamber 201 are removed from the interior of the process chamber 201 according to the same processing procedure as in the purge in step C1 (purge).

(Performing Predetermined Number of Times)

By performing a cycle a predetermined number of times (n times, where n is an integer of 1 or more), the cycle including non-simultaneously, that is, without synchronization, performing the above-described steps D1 to D4, it is possible to form a SiOCN film having a predetermined composition and a predetermined film thickness on the wafer 200, that is, on the SiN film formed on the wafer 200 by performing the first film formation.

Figure 7D:
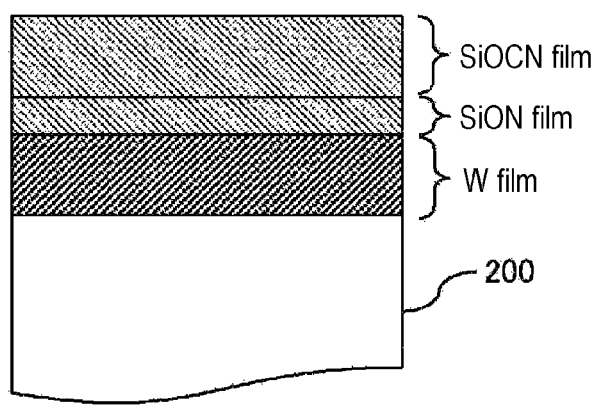
FIG. 7D is an enlarged cross-sectional view on the surface of the wafer after second film formation is performed to form a SiOCN film on the SiN film and the SiN film formed in the first film formation is modified into a SiON film.

In the second film formation, in the process of forming the SiOCN film, it is possible to supply a portion of the O component supplied to the wafer 200 or a portion of the O component contained in the SiOCN layer formed on the wafer 200 to the SiN film which is the base of the second film formation. Accordingly, since the O component can be diffused and added into the SiN film that is the base of the second film formation, it is possible to modify (oxidize) this SiN film into a SiON film having a lower dielectric constant than the SiN film. As a result, as shown in FIG. 7D, it is possible to form a laminated film in which the SiON film and the SiOCN film having low dielectric constants are laminated in this order, on the wafer 200, that is, on the W film exposed on the wafer 200. This laminated film becomes a so-called low dielectric constant film (low-k film).

When the second film formation is performed, the O component that may diffuse below the SiN film, that is, to the W film side that is the base when forming the laminated film, is trapped by the SiN film, that is, as the SiN film itself is oxidized, so that its diffusion to the W film side is blocked. By limiting the diffusion of the O component into the W film by the SiN film in this way, it is possible to suppress re-oxidation of the W film from which the WO layer has been removed by the temperature rise of the wafer 200 under the $H_2$ gas atmosphere. In the present disclosure, the effect of blocking the diffusion of the O component into the W film, which is obtained by the SiN film, that is, the effect of suppressing the oxidation of the W film, is also referred to as an oxidation-blocking effect.

The thickness of the SiOCN film formed in the second film formation may be thicker than the thickness of the SiN film formed in the first film formation. That is, the thickness of the SiN film formed in the first film formation may be thinner than the thickness of the SiOCN film formed in the second film formation. By doing so, when the second film formation is performed, it is possible to oxidize the entire SiN film formed in the first film formation to be modified into the SiON film, which makes it possible to modify the entire SiN film formed in the first film formation into a low dielectric constant film. As a result, it is possible to reduce the total dielectric constant of the laminated film in which the first film and the second film are laminated. Further, by making the thickness of the SiOCN film having a lower dielectric constant than the SiON film thicker than the thickness of the SiON film, that is, by making the thickness of the SiON film having a higher dielectric constant than the SiOCN film thinner than the thickness of the SiOCN film, it is possible to reduce the average dielectric constant of the laminated film in which the SiOCN film and the SiON film are laminated.

The above-mentioned cycle may be repeated multiple times. That is, the thickness of the SiOCN layer formed when the above-mentioned cycle is performed once may be set to be smaller than a desired film thickness, and the above-mentioned cycle may be repeated multiple times until the film thickness of a SiOCN film formed by laminating SiOCN layers reaches the desired film thickness.

(After-Purging and Returning to Atmospheric Pressure)

After the formation of the SiOCN film as the second film and the modification of the SiN film formed as the first film into the SiON film are completed, a $N_2$ gas as a purge gas is supplied from each of the nozzles 249a and 249b into the process chamber 201 and is exhausted through the exhaust port 231a. Thus, the interior of the process chamber 201 is purged to remove a gas, reaction by-products, and the like remaining in the process chamber 201 from the interior the process chamber 201 (after-purge). After that, the internal atmosphere of the process chamber 201 is substituted with an inert gas (inert gas substitution) and the internal pressure of the process chamber 201 is returned to an atmospheric pressure (returning to atmospheric pressure).

(Boat Unloading and Wafer Discharging)

The seal cap 219 is moved down by the boat elevator 115 to open the lower end of the manifold 209. In addition, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter close). The processed wafers 200 are unloaded out of the reaction tube 203 and are then discharged from the boat 217 (wafer discharging).

(3) Effects According to the Present Embodiments

According to the present embodiments, one or more effects set forth below may be achieved.
- (a) By performing the boat loading under the first temperature, it is possible to suppress the oxidation of the W film exposed on the surface of the wafer 200. This makes it possible to suppress formation of a further WO layer on the surface of the W film, increase in the thickness of the already-formed WO layer, etc.
- (b) By performing the ramp-up+$H_2$ pre-flow while raising the temperature of the wafer 200 to the second temperature higher than the first temperature, it is possible to remove the WO layer formed on the surface of the W film. It is also possible to prevent re-oxidation of the surface of the W film after removing the WO layer.
- (c) By performing the first film formation before the second film formation, when the second film formation is performed, it is possible to block the O component that may diffuse below the SiN film, that is, the O component that may reach the W film. The diffusion-blocking action of the O component by this SiN film makes it possible to prevent the re-oxidation of the W film from which the WO layer has been removed by the ramp-up+$H_2$ pre-flow.
- (d) In the second film formation, by using the second process gas including an oxidizing gas, it is possible to form the SiOCN film having a low dielectric constant on the wafer 200.
- (e) By performing the second film formation, it is possible to oxidize the SiN film formed in the first film formation to form the SiON film. As a result, it is possible to make the laminated film, which is formed by laminating the first film and the second film, into a low dielectric constant film.
- (f) By making the thickness of the SiOCN film formed in the second film formation thicker than the thickness of the SiN film formed in the first film formation, that is, by making the thickness of the SiN layer formed in the first film formation thinner than the thickness of the SiOCN film formed in the second film formation, the oxidation of the SiN film can be promoted, which makes it possible to further lower the dielectric constant of the laminated film formed by laminating the first film and the second film. Further, by increasing the ratio of the thickness occupied by the second film having a particularly low dielectric constant to the total film thickness of the laminated film, that is, by decreasing the ratio of the thickness occupied by the first film having a higher dielectric constant than the second film to the total film thickness of the laminated film, it is possible to further lower the average dielectric constant of the laminated film.
- (g) As described above, according to the present embodiments, while an oxide film (the laminated film of the first film and the second film) formed on the W film is a low dielectric constant film, it is possible to suppress the oxidation of the W film which is the base of the oxide film. The laminated film formed by the method of the present embodiments can be suitably applied to, for example, a sidewall spacer, a hard mask, an etch stopper, and the like in a logic device such as a MPU, or a memory device such as a DRAM or a 3D NAND.
- (h) By setting the second temperature and the third temperature to the same temperature, it is not required to provide a step (temperature-rising step or temperature-falling step) of changing the temperature of the wafer 200 between the first film formation and the second film formation, which makes it possible to improve the throughput of substrate processing.
- (i) The effects of the present embodiments can be similarly obtained even when a precursor gas other than the HCDS gas is used, when a C-containing gas other than the $C_3H_6$ gas is used, when an O-containing gas other than the $O_2$ gas is used, when a N- and H-containing gas other than the $NH_3$ gas is used, when a reducing gas other than the $H_2$ gas is used, and when an inert gas other than the $N_2$ gas is used.

Other Embodiments

The embodiments of the present disclosure have been specifically described above. However, the present disclosure is not limited to the above-described embodiments, and various changes can be made without departing from the gist of the present disclosure.

In the above-described embodiments, the W film, which is an elemental metal film, is exemplified as a conductive metal-containing film exposed on the surface of the substrate, but the present disclosure is not limited to such embodiments. For example, the conductive metal-containing film exposed on the surface of the substrate may be a metal nitride film such as a titanium nitride film (TiN film) or a tungsten nitride film (WN film), or an elemental metal film such as an aluminum film (Al film), a cobalt film (Co film), a nickel film (Ni film), a platinum film (Pt film), or a copper film (Cu film). Even in these cases, the same effects as those in the above-described embodiments can be obtained. In the present disclosure, the conductive metal-containing film such as the TiN film or the W film is also simply referred to as a metal film.

In the first film formation, as the first process gas (precursor gas), in addition to the above-mentioned various halosilane-based gases such as the HCDS gas, it may be possible to use, e.g., an alkylhalosilane-based gas such as a 1,1,2,2-tetrachloro-1,2-dimethyldisilane $((CH_3)_2Si_2Cl_4$, abbreviation: TCDMDS) gas, an alkylsilane-based gas such as a hexamethyldisilane $((CH_3)_3\text{—Si—Si—}(CH_3)_3$, abbreviation: HMDS) gas, or an alkylenesilane-based gas such as a 1,4-disilabutane $(Si_2C_2H_{10}$, abbreviation: DSB) gas. For example, as a gas that promotes decomposition of the precursor gas, a $H_2$ gas, a trichloroborane $(BCl_3)$ gas, or the like may be added to the precursor gas. Further, as the first process gas (reaction gas), in addition to the above-mentioned various reaction gases, it may be possible to use an amine-based gas such as a triethylamine $((C_2H_5)_3N$, abbreviation: TEA) gas. Then, according to the gas-supplying sequences shown below, a SiN film, a silicon carbide film (SiC film), or a silicon carbonitride film (SiCN film) may be formed as the first film on the wafer 200, that is, on a metal-element-containing film exposed on the surface of the wafer 200 and from which a native oxide film has been removed by a reduction process. Even in this case, the same effects as those in the above-described embodiments can be obtained. The alkylhalosilane-based gas, the alkylsilane-based gas, and the alkylenesilane-based gas are gases that act as a Si source and a C source, and the amine-base gas is a gas that acts as a N source and a C source.

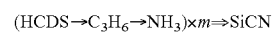

(TCDMDS→NH₃)×m⇒SiCN (DSB+H₂)×m⇒SiC (DSB+BCl₃)×m⇒SiC

When the SiC film or the SiCN film is formed as the first film in the first film formation, the SiC film or the SiCN film formed in the first film formation is oxidized by performing the second film formation, so as to be modified into a SiOC film or a SiOCN film, respectively. In this case, since the SiOC film and the SiOCN film have a lower dielectric constant than the SiON film, it is possible to further lower the dielectric constant of the laminated film formed by laminating the first film and the second film.

In the second film formation, as the second process gas (precursor gas), in addition to the above-mentioned various halosilane-based gases such as the HCDS gas, it may be possible to use an alkylhalosilane-based gas such as a TCDMDS gas, an alkylsilane-based gas such as a HMDS gas, an alkylenesilane-based gas such as a DSB gas. Further, as the second process gas (reaction gas), in addition to the above-mentioned various reaction gases, it may be possible to use an amine-based gas such as a TEA gas. Then, according to the gas-supplying sequences shown below, a SiOCN film may be formed as the second film on the wafer 200, that is, on the first film. Further, the type of the second process gas may be appropriately selected to form a silicon oxide film (SiO film), a silicon oxynitride film (SiON film), and a silicon oxycarbide film (SiOC film) as the second film. Even in this case, the same effects as those in the above-described embodiments can be obtained.

(HCDS→C₃H₆→NH₃→O₂)×n⇒SiOCN (HCDS→TEA→O₂)×n⇒SiOCN (TCDMDS→NH₃→O₂)×n⇒SiOCN

Recipes used in each process may be prepared individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which a film is formed by using a batch-type substrate processing apparatus capable of processing a plurality of substrates at a time has been described in the above-described embodiments. The present disclosure is not limited to the above-described embodiments, but may be suitably applied, for example, to a case where a film is formed by using a single-wafer-type substrate processing apparatus capable of processing a single substrate or several substrates at a time. In addition, the example in which a film is formed by using a substrate processing apparatus including a hot-wall-type process furnace has been described in the above-described embodiments. The present disclosure is not limited to the above-described embodiments, but may be suitably applied to a case where a film is formed by using a substrate processing apparatus including a cold-wall-type process furnace.

Even in the case of using these substrate processing apparatuses, each process may be performed according to the same processing procedures and process conditions as those in the above-described embodiments, and the same effects as those in the above-described embodiments can be achieved.

The above-described embodiments may be used in proper combination. The processing procedures and process conditions used in this case may be the same as, for example, the processing procedures and process conditions of the above-described embodiments.

EXAMPLES

Figure 6:
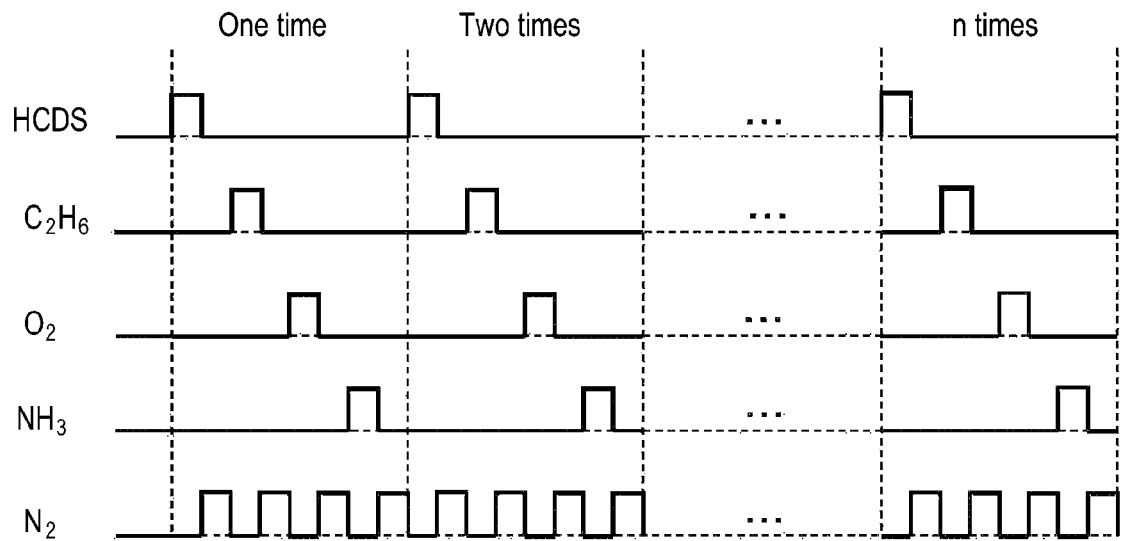
FIG. 6 is a diagram showing a gas-supplying sequence in second film formation according to one or more embodiments of the present disclosure.

As Samples 1 to 5, the above-described substrate processing apparatus was used to form a SiOCN film on a wafer in which a W film was exposed on the surface of the wafer according to the gas-supplying sequence shown in FIG. 6. Before performing wafer charging and boat loading, the composition in the thickness direction of the W film in the initial state in the wafer of Samples 1 to 5 was measured by XPS, respectively. As a result of the measurement, the ratio (%) of the thickness of a W layer, which is an unoxidized portion of the W film, and the thickness of a WO layer, which is an oxidized portion of the W film, was 70:30.

When preparing Sample 1, the boat loading and the ramp-up+H₂ pre-flow under the first temperature were performed in this order, and then, without performing the first film formation, the second film formation was performed to directly form a SiOCN film on the W film without forming a SiN film on the W film. When preparing Samples 2 to 5, the boat loading and the ramp-up+H₂ pre-flow under the first temperature were performed in this order, and then, the first film formation and the second film formation were performed in this order to form a SiN film and a SiOCN film on the W film in this order. That is, Samples 2 to 5 were prepared according to the substrate-processing sequence shown in FIG. 4. The process conditions in each step when preparing each sample were set to predetermined conditions within the process condition range described in the above-described embodiments. The process conditions for performing the second film formation were the same conditions for each sample. The thickness of the SiN film and the SiOCN film in each sample was the thickness shown in FIG. 8, respectively.

After preparing Samples 1 to 5, the composition of the W film in Samples 1 to 5 was measured by XPS, respectively. The result is shown in FIG. 8. As shown in FIG. 8, in Samples 2 to 5 in which the SiN film was formed before the SiOCN film was formed, the existence of the WO layer in the W film could not be confirmed. It is considered that this is because the WO film formed on the surface of the W film in the initial state was removed by the ramp-up+H₂ pre-flow and the re-oxidation of the W film when forming the SiOCN film could be avoided by the SiN film. On the other hand, in Sample 1 in which the SiN film was not formed before the SiOCN film was formed, the existence of the WO layer in the W film was confirmed. It is considered that this is because the WO film formed on the surface of the W film in the initial state was removed by the ramp-up+H₂ pre-flow, but a portion of the W film was re-oxidized when the SiOCN film was formed.

According to the present disclosure, it is possible to provide a technique capable of suppressing the oxidation of a film formed on a substrate when the base of the film is a metal-element-containing film, while the film is a low dielectric constant film.

What is claimed is:

1. A method of manufacturing a semiconductor device, comprising:
    (a) loading a substrate where a conductive metal-element-containing film is exposed on a surface of the substrate into a process chamber under a first temperature;
    (b) supplying a reducing gas to the substrate while raising a temperature of the substrate to a second temperature higher than the first temperature in the process chamber;
    (c) forming a first film, which contains silicon and at least one selected from the group of nitrogen and carbon and does not contain oxygen, on the metal-element-containing film, by supplying a first process gas, which does not include an oxidizing gas, to the substrate under the second temperature in the process chamber; and
    (d) forming a second film, which contains silicon, oxygen, carbon, and nitrogen, on the first film such that the second film is thicker than the first film, by supplying a second process gas, which includes an oxidizing gas, to the substrate under a third temperature higher than the first temperature in the process chamber.

2. The method of claim 1, wherein the first temperature is set to a room temperature or higher and 200 degrees C. or lower.

3. The method of claim 1, wherein the first temperature is set to a room temperature or higher and 150 degrees C. or lower.

4. The method of claim 1, wherein at least one selected from the group of a hydrogen gas and a deuterium gas is used as the reducing gas.

5. The method of claim 1, wherein in (b), a native oxide film formed on a surface of the metal-element-containing film is removed by the temperature rise under a reducing gas atmosphere.

6. The method of claim 5, wherein in (b), an oxidation of the surface of the metal-element-containing film where the native oxide film has been removed is prevented.

7. The method of claim 6, wherein the second temperature is set to 500 degrees C. or higher and 800 degrees C. or lower.

8. The method of claim 6, wherein the second temperature is set to 600 degrees C. or higher and 700 degrees C. or lower.

9. The method of claim 1, wherein the first film includes at least one selected from the group of a silicon nitride film, a silicon carbide film, and a silicon carbonitride film.

10. The method of claim 1, wherein a thickness of the first film is 0.16 nm or more and 1 nm or less.

11. The method of claim 1, wherein a thickness of the first film is 0.16 nm or more and 0.48 nm or less.

12. The method of claim 1, wherein a thickness of the first film is 0.16 nm or more and 0.32 nm or less.

13. The method of claim 1, wherein the first process gas includes:
    a gas serving as a silicon source or a gas serving as a silicon source and a carbon source; and
    a gas serving as at least one selected from the group of a nitrogen source and a carbon source, and
    wherein in (c), a cycle which includes supplying the respective gases of the first process gas is performed one to three times.

14. The method of claim 1, wherein the first process gas includes:
    a gas serving as a silicon source or a gas serving as a silicon source and a carbon source; and
    a gas serving as at least one selected from the group of a nitrogen source and a carbon source,
    wherein in (c), the respective gases of the first process gas are intermittently supplied to the substrate,
    wherein the second process gas includes:
    a gas serving as a silicon source or a gas serving as a silicon source and a carbon source;
    a gas serving as at least one selected from the group of a nitrogen source and a carbon source; and
    a gas serving as an oxygen source, and
    wherein in (d), the respective gases of the second process gas are intermittently and non-simultaneously supplied to the substrate.

15. The method of claim 1, wherein in (d), the first film formed in (c) is modified into a film having a dielectric constant lower than a dielectric constant of the first film before performing (d).

16. The method of claim 1, wherein in (c), a silicon carbonitride film is formed as the first film, and
    wherein in (d), a silicon oxycarbonitride film is formed as the second film, and the first film is modified from the silicon carbonitride film into a silicon oxycarbonitride film.

17. The method of claim 16, wherein the first process gas includes:
    a gas serving as a silicon source;
    a gas serving as a carbon source; and
    a gas serving as a nitrogen source,
    wherein in (c), the respective gases of the first process gas are intermittently supplied to the substrate, and
    wherein the second process gas includes:
    a gas serving as a silicon source;
    a gas serving as a carbon source;
    a gas serving as a nitrogen source; and
    a gas serving as an oxygen source, and
    wherein in (d), the respective gases of the second process gas are intermittently and non-simultaneously supplied to the substrate.

18. The method of claim 1, wherein the second temperature and the third temperature are set to be the same temperature.

19. A method of processing a substrate, comprising:
    (a) loading the substrate where a conductive metal-element-containing film is exposed on a surface of the substrate into a process chamber under a first temperature;
    (b) supplying a reducing gas to the substrate while raising a temperature of the substrate to a second temperature higher than the first temperature in the process chamber;
    (c) forming a first film, which contains silicon and at least one selected from the group of nitrogen and carbon and does not contain oxygen, on the metal-element-containing film, by supplying a first process gas, which does not include an oxidizing gas, to the substrate under the second temperature in the process chamber; and
    (d) forming a second film, which contains silicon, oxygen, carbon, and nitrogen, on the first film such that the second film is thicker than the first film, by supplying a second process gas, which includes an oxidizing gas, to the substrate under a third temperature higher than the first temperature in the process chamber.

20. A substrate processing apparatus comprising:

a process chamber in which a substrate is processed;

a heater configured to heat the substrate in the process chamber;

a reducing gas supply system configured to supply a reducing gas to the substrate in the process chamber;

a first process gas supply system configured to supply a first process gas, which does not include an oxidizing gas, to the substrate in the process chamber;

a second process gas supply system configured to supply a second process gas, which includes an oxidizing gas, to the substrate in the process chamber;

a transfer system configured to transfer the substrate into the process chamber; and a controller configured to be capable of controlling the heater, the reducing gas supply system, the first process gas supply system, the second process gas supply system, and the transfer system so as to perform a process including:
  (a) loading the substrate where a conductive metal-element-containing film is exposed on a surface of the substrate into the process chamber under a first temperature;
  (b) supplying the reducing gas to the substrate while raising a temperature of the substrate to a second temperature higher than the first temperature in the process chamber;
  (c) forming a first film, which contains silicon and at least one selected from the group of nitrogen and carbon and does not contain oxygen, on the metal-element-containing film, by supplying the first process gas to the substrate under the second temperature in the process chamber; and
  (d) forming a second film, which contains silicon, oxygen, carbon, and nitrogen, on the first film such that the second film is thicker than the first film, by supplying the second process gas to the substrate under a third temperature higher than the first temperature in the process chamber.

21. A non-transitory computer-readable recording medium storing a program that causes, by a computer, a substrate processing apparatus to perform a process comprising:
  (a) loading a substrate where a conductive metal-element-containing film is exposed on a surface of the substrate into a process chamber of the substrate processing apparatus under a first temperature;
  (b) supplying a reducing gas to the substrate while raising a temperature of the substrate to a second temperature higher than the first temperature in the process chamber;
  (c) forming a first film, which contains silicon and at least one selected from the group of nitrogen and carbon and does not contain oxygen, on the metal-element-containing film, by supplying a first process gas, which does not include an oxidizing gas, to the substrate under the second temperature in the process chamber; and
  (d) forming a second film, which contains silicon, oxygen, carbon, and nitrogen, on the first film such that the second film is thicker than the first film, by supplying a second process gas, which includes an oxidizing gas, to the substrate under a third temperature higher than the first temperature in the process chamber.

* * * * *